(12) United States Patent
Kikuchi (10) Patent No.: US 9,437,450 B2
(45) Date of Patent: Sep. 6, 2016

(54) PLASMA ETCHING METHOD (71) Applicant: TOKYO ELECTRON LIMITED, Tokyo (JP)

(72) Inventor: Tetsuro Kikuchi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/427,076

(22) PCT Filed: Sep. 24, 2013

(86) PCT No.: PCT/JP2013/075708
§ 371 (c)(1),
(2) Date: Mar. 10, 2015

(87) PCT Pub. No.: WO2014/057799
PCT Pub. Date: Apr. 17, 2014

(65) Prior Publication Data
US 2015/0340243 A1 Nov. 26, 2015

Related U.S. Application Data (60) Provisional application No. 61/715,988, filed on Oct. 19, 2012.

(30) Foreign Application Priority Data

Oct. 12, 2012 (JP) .................................. 2012-227108

(51) Int. Cl.
*H01L 21/461* (2006.01)
*H01L 21/311* (2006.01)
*H01L 21/67* (2006.01)
*H01L 21/683* (2006.01)
*H01J 37/32* (2006.01)

(52) U.S. Cl.
CPC .... *H01L 21/31116* (2013.01); *H01L 21/31144* (2013.01); *H01J 37/32091* (2013.01); *H01J 2237/334* (2013.01); *H01L 21/67109* (2013.01); *H01L 21/6831* (2013.01)

(58) Field of Classification Search
CPC .................... H01L 21/31116; H01L 21/3065; H01L 21/6831; H01L 21/31144
See application file for complete search history.

(56) References Cited

U.S. PATENT DOCUMENTS

| 8,603,293 B2 | 12/2013 | Koshiishi et al. | |
|---|---|---|---|
| 2008/0194114 A1* | 8/2008 | Yoshida ............ | H01L 21/76816 438/714 |

(Continued)

FOREIGN PATENT DOCUMENTS

JP    2011-97063 A    5/2011

OTHER PUBLICATIONS

International Search Report mailed Dec. 17, 2013 in PCT/JP2013/075708.

*Primary Examiner* — Bradley K Smith
(74) *Attorney, Agent, or Firm* — Rothwell, Figg, Ernst & Manbeck, P.C.

(57) ABSTRACT

In a plasma etching method, with respect to a substrate to be processed, which has a base layer, a silicon oxide film, and an etching mask formed in this order, the etching mask having an etching pattern formed thereon and being formed of polysilicon, a silicon-containing deposit is deposited on a surface of the etching mask using a plasma generated from a processing gas, while applying a negative direct current voltage to an upper electrode formed of silicon. Furthermore, in the plasma etching method, the silicon oxide film is etched using plasma generated from a first CF-based gas using, as a mask, the etching mask having the silicon-containing deposit deposited thereon.

5 Claims, 9 Drawing Sheets

(56) References Cited

U.S. PATENT DOCUMENTS

| | | | |
|---|---|---|---|
| 2011/0195577 A1* | 8/2011 | Kushibiki | H01J 37/32091 438/714 |
| 2012/0220135 A1* | 8/2012 | Nakagawa | H01L 21/31144 438/714 |
| 2012/0225502 A1* | 9/2012 | Nakagawa | H01L 21/31144 438/14 |

* cited by examiner

PLASMA ETCHING METHOD

CROSS REFERENCE TO RELATED APPLICATION

This application is a 35 U.S.C. 371 National Phase Entry Application from PCT/JP2013/075708, filed Sep. 24, 2013, which claims priority to and the benefit of U.S. Provisional Application No. 61/715,988, filed Oct. 19, 2012 and Japanese Patent Application No. 2012-227108, filed Oct. 12, 2012, the disclosures of which are incorporated herein in their entirety by reference.

FIELD OF THE INVENTION

The present invention relates to a plasma etching method.

BACKGROUND OF THE INVENTION

Conventionally, a plasma processing apparatus performs etching while using a photoresist as a mask, for example. There is a method for modifying a composition of the photoresist used as the mask by the plasma processing apparatus.

Patent Document 1: Japanese Patent Application Publication No. 2011-097063

However, the above conventional method has a problem that a mask selectivity is decreased in the case of using a polysilicon mask as the mask.

SUMMARY OF THE INVENTION

A plasma etching method disclosed herein, in an embodiment, includes: a deposition step of depositing a silicon-containing deposit by a plasma of a processing gas while applying a negative DC voltage to an upper electrode made of silicon to a substrate to be processed including a base layer, a silicon oxide film, and an etching mask formed of a polysilicon and having an etching pattern which are formed in this order. Further, the plasma etching method includes an etching step of etching the silicon oxide film by a plasma of a first CF-based gas while using as a mask the etching mask having the silicon-containing deposit deposited thereon.

Effect of the Invention

The above method can improve the mask selectivity in the case of using a polysilicon mask as a mask.

DETAILED DESCRIPTION OF THE EMBODIMENTS

Hereinafter, embodiments of a plasma etching method will be described in detail with reference to the accompanying drawings. The present invention is not limited to the embodiments to be described below. The embodiments can be appropriately combined within a range that does not contradict the processing contents.

First Embodiment

A plasma etching method disclosed herein, in a first embodiment, includes: a deposition step of depositing a silicon-containing deposit by a plasma of a processing gas while applying a negative DC voltage to an upper electrode made of silicon to a substrate to be processed including a base layer, a silicon oxide film, and an etching mask formed of a polysilicon and having an etching pattern which are formed in this order. Further, the plasma etching method includes an etching step of etching the silicon oxide film by a plasma of a first CF-based gas while using as a mask the etching mask having the silicon-containing deposit deposited thereon.

Further, in the plasma etching method in accordance with the first embodiment, the processing gas is selected among $H_2/Ar$ gas, $CF_4/H_2/Ar$ gas and $CF_4/COS/Ar$ gas.

Further, in the plasma etching method in accordance with the first embodiment further includes, after the deposition step and before the etching step, a deposition step of depositing a CF-based deposit by a plasma of a second CF-based processing gas.

Further, in the plasma etching method in accordance with the first embodiment, the first CF-based gas is $C_4F_6/C_4F_8/Ar/O_2$ gas.

Further, in the plasma etching method of the first embodiment, the second CF-based gas is $C_4F_6/Ar/O_2$ gas.

Embodiment of Plasma Etching Apparatus

Figure 1:
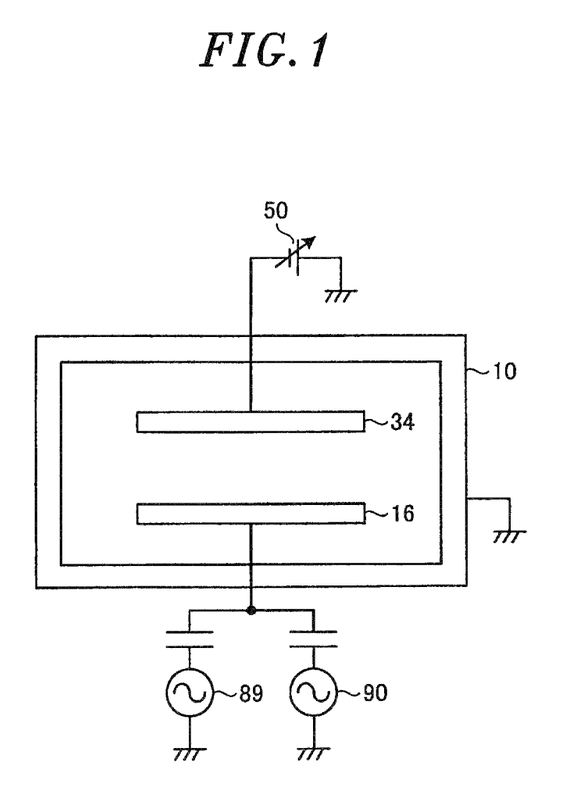
FIG. 1 is a simplified cross sectional view schematically showing a plasma etching apparatus used for a plasma etching method in accordance with an embodiment of the present invention.

FIG. 1 is a simplified cross sectional view schematically showing a plasma etching apparatus used for a plasma etching method in accordance with an embodiment of the present invention. As shown in FIG. 1, the plasma etching apparatus is of a dual frequency application type in which a high frequency power having a frequency of, e.g., 40 MHz, for plasma generation is applied from a first high frequency power supply 89 to a susceptor 16 serving as a lower electrode and a high frequency power having a frequency of, e.g., 2 MHz, for ion attraction is applied from a second high frequency power supply 90 to the susceptor 16. As illustrated, it is a plasma etching apparatus in which a predetermined DC voltage is applied to an upper electrode 34 from a variable DC power supply 50.

Figure 2:
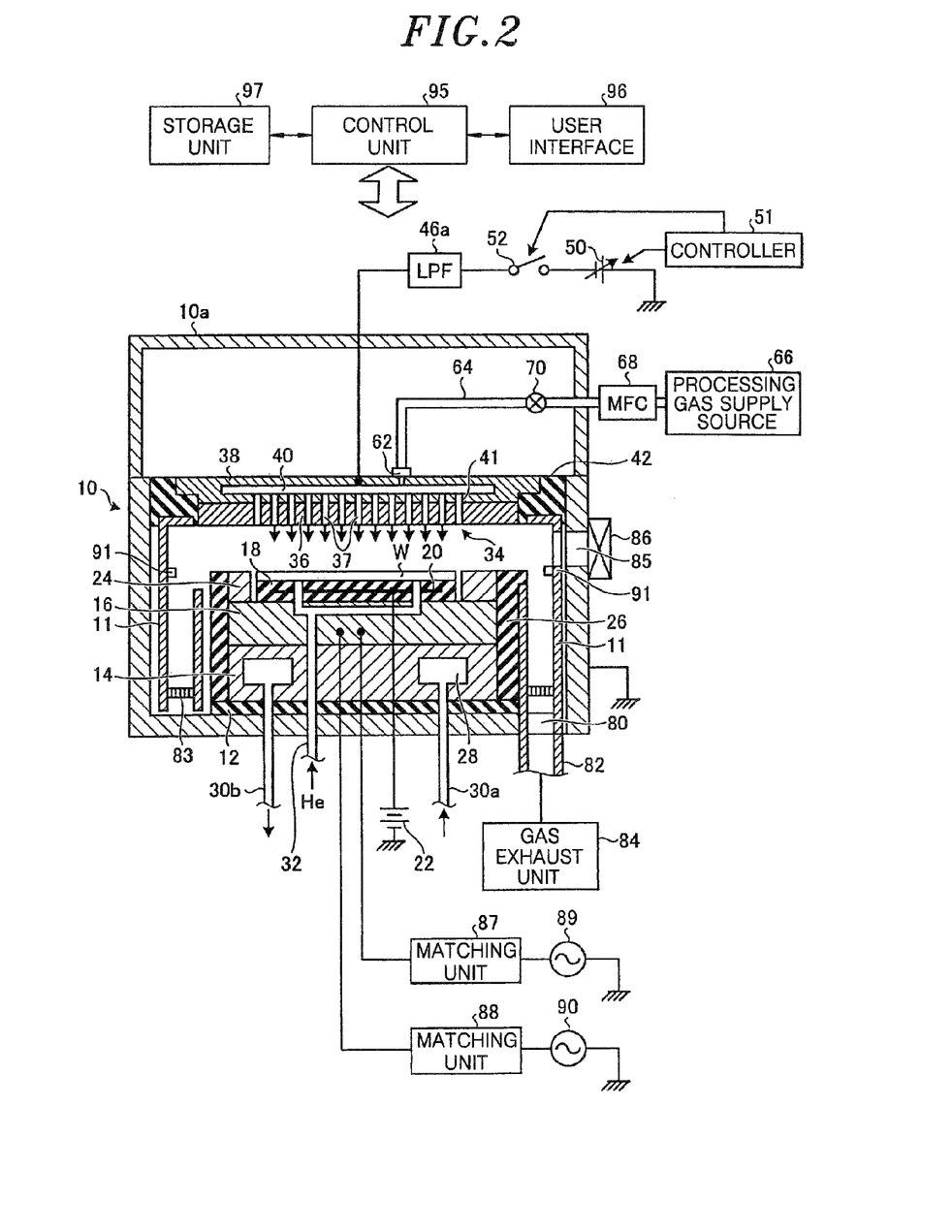
FIG. 2 is a schematic cross sectional view showing the plasma etching apparatus used for the plasma etching method in accordance with the embodiment of the present invention.

FIG. 2 is a schematic view of a plasma etching apparatus used for the plasma etching method in accordance with the embodiment of the present invention. The plasma etching apparatus is configured as a capacitively coupled parallel plate type plasma etching apparatus. The plasma etching apparatus includes an approximately cylindrical chamber (processing container) 10 having an anodically oxidized surface made of aluminum, for example. The chamber 10 is grounded.

A cylindrical susceptor support 14 is provided at a bottom portion of the chamber 10 via an insulating plate 12 made of ceramic or the like. A susceptor 16 made of, e.g., aluminum, is provided on the susceptor support 14. The susceptor 16 serves as a lower electrode and mounts thereon a semiconductor wafer W as a substrate to be processed.

An electrostatic chuck 18 for adsorptively holding the semiconductor wafer W by electrostatic force is provided on the top surface of the susceptor 16. The electrostatic chuck 18 is formed by embedding an electrode 20 made of a conductive film between a pair of insulating films or insulating sheets. A DC power supply 22 is electrically connected to the electrode 20. The semiconductor wafer W is adsorptively held on the electrostatic chuck 18 by electrostatic force such as Coulomb force or the like which is generated by the DC voltage from the DC power supply 22.

A conductive focus ring (correction ring) 24 for improving uniformity of etching is provided on the top surface of the susceptor 16 to surround the electrostatic chuck 18 (semiconductor wafer W). The focus ring (correction ring) 24 is made of, e.g., silicon. A cylindrical inner wall member 26 made of, e.g., quartz, is disposed at side surfaces of the susceptor 16 and the susceptor support 14.

An annular coolant path 28 is formed inside the susceptor support 14. A coolant of a predetermined temperature is supplied from a chiller (not shown) provided outside into the coolant path 28 through lines 30a and 30b to be circulated therein. A processing temperature of the semiconductor wafer W on the susceptor 16 is controlled by a temperature of the coolant.

A heat transfer gas, e.g., He gas, from a heat transfer gas supply unit (not shown) is supplied to a gap between the top surface of the electrostatic chuck 18 and the backside of the semiconductor wafer W through a gas supply line 32.

The upper electrode 34 is provided above the susceptor 16 serving as the lower electrode to face the susceptor 16 in parallel. A space between the upper electrode 34 and the lower electrode 16 serves as a plasma generation space. The upper electrode 34 forms a surface, i.e., a facing surface, that faces the semiconductor wafer W on the susceptor 16 serving as the lower electrode and comes into contact with the plasma generation space.

The upper electrode 34 is supported at an upper portion of the chamber 10 through an insulating shielding member 42. The upper electrode 34 includes: an electrode plate 36, forming the facing surface opposite to the susceptor 16, having a plurality of gas injection openings 37; and an electrode holder 38, having a water-cooled structure, made of a conductive material, for detachably holding the electrode plate 36. The conductive material forming the electrode holder 38 is, e.g., anodically oxidized aluminum. The electrode plate 36 is made of a silicon-containing material, e.g., silicon. A gas diffusion space 40 is provided inside the electrode holder 38. A plurality of gas holes 41 communicating with the gas injection openings 37 extend downward from the gas diffusion space 40.

A gas inlet port 62 for introducing a processing gas into the gas diffusion space 40 is formed at the electrode holder 38. A gas supply line 64 is connected to the gas inlet port 62. A processing gas supply source 66 is connected to the gas supply line 64. A mass flow controller (MFC) 68 and an opening/closing valve 70 are provided in this order from the upstream side on the gas supply line 64. A processing gas for etching, e.g., a fluorocarbon gas (CxFy) such as $C_4F_8$ gas, from the processing gas supply source 66 reaches the gas diffusion space 40 through the gas supply line 64 and injected into the plasma generation space in a shower shape through the gas holes 41 and the gas injection openings 37. In other words, the upper electrode 34 serves as a shower head for supplying a processing gas.

As will be described later, a processing gas used for depositing a silicon-containing deposit, a first CF-based gas, a second CF-based gas or the like is supplied from the processing gas supply source 66. The gases supplied from the processing gas source 66 will be described later in detail.

A variable DC power supply 50 is electrically connected to the upper electrode 34 via a low pass filter LPF 46a. The variable DC power supply 50 may be a bipolar power supply. The power supply from the variable DC power supply 50 can be turned on/off by an on/off switch 52. The polarity and current/voltage of the variable DC power supply 50 and on/off of the on/off switch 52 can be controlled by a controller (control unit) 51.

The LPF 46a is configured to trap a high frequency from a first and a second high frequency power supply which will be described later. The LPF 46a is preferably formed of an LR filter or an LC filter.

A cylindrical ground conductor 10a extends from the sidewall of the chamber 10 upward beyond a height position of the upper electrode 34. The cylindrical ground conductor 10a has a ceiling wall at an upper portion thereof.

A first high frequency power supply 89 is electrically connected to the susceptor 16 serving as the lower electrode via a matching unit 87. A second high frequency power supply 90 is electrically connected to the susceptor 16 via a matching unit 88. The first high frequency power supply 89 outputs a high frequency power having a frequency of 27 MHz or above, e.g., 40 MHz. The second high frequency power supply 90 outputs a high frequency power having a frequency of 13.56 MHz or less, e.g., 2 MHz.

The matching units 87 and 88 for matching a load impedance with an internal (or output) impedance of the first and the second high frequency power supply 89 and 90 function such that the load impedance and the internal impedance of the first and the second high frequency power supply 89 and 90 apparently match when a plasma is generated in the chamber 10.

A gas exhaust port 80 is formed at the bottom portion of the chamber 10. A gas exhaust unit 84 is connected to the gas exhaust port 80 through a gas exhaust line 82. The gas exhaust unit 84 includes a vacuum pump such as a turbo molecular pump or the like and can decrease a pressure in the chamber 10 to a desired vacuum level. A loading/unloading port 85 for the semiconductor wafer W is provided at the sidewall of the chamber 10. The loading/unloading port 85 can be opened and closed by a gate valve 86. A deposition shield 11 is detachably provided along the sidewall of the chamber 10 to prevent adhesion of an etching by-product (deposit). In other words, the deposition shield 11 forms a chamber wall. The deposition shield 11 is also provided at a periphery of the inner wall member 26. At a lower bottom portion of the chamber 10, a gas exhaust plate 83 is provided between the deposition shield 11 on the chamber wall side and the deposition shield 11 on the inner wall member 26 side. Aluminum coated with ceramic such as $Y_2O_3$ or the like may be suitably used for the deposition shield 11 and the gas exhaust plate 83.

A conductive member (GND block) 91 is disposed at a portion of the deposition shield 11 which forms the inner wall of the chamber 10 at a height substantially the same as the semiconductor wafer W, the GND block 91 being DC-connected to ground. Accordingly, an abnormal discharge prevention effect to be described later is produced.

Each component of the plasma etching apparatus is connected to and controlled by a control unit (entire control unit) 95. The control unit 95 is connected to a user interface 96 including a keyboard and a display. The keyboard is used for a process manager to input commands for managing the plasma etching apparatus. The display is used for displaying visualized images of the operational states of the plasma processing apparatus.

The control unit 95 is connected to a storage unit 97 that stores control programs for realizing various processes performed in the plasma etching apparatus under the control of the control unit 95 and programs, i.e., recipes, for respective components of the plasma etching apparatus to perform the processes based on the processing conditions. The recipes are stored in a hard disk or a semiconductor memory or may be set in a predetermined position of the storage unit 97 while being stored in a computer-readable storage medium such as a CDROM, a DVD or the like.

In the plasma etching apparatus, if necessary, a required recipe is retrieved from the storage unit 97 by an instruction from the user interface 96 and then executed by the controller 95. Accordingly, a desired process is performed in the plasma etching apparatus under the control of the controller 95.

In the plasma etching apparatus configured as described above, in order to perform etching, first, the gate valve 86 is opened. Next, the semiconductor wafer W to be etched is loaded into the chamber 1 through the loading/unloading port 85 and mounted on the susceptor 16. A processing gas for etching is supplied at a predetermined flow rate from the processing gas supply source 66 into the gas diffusion space 40 and then into the chamber 10 through the gas holes 41 and the gas injection openings 37. The chamber 10 is exhausted by the gas exhaust unit 84 and a pressure therein is set within a range from about 0.1 Pa to 150 Pa, for example.

In a state where the etching gas is introduced into the chamber 10, the high frequency power for plasma generation is applied from the first high frequency power supply 89 to the susceptor 16 serving as the lower electrode at a predetermined power level and, also, the high frequency power for ion attraction is applied from the second high frequency power supply 90 to the susceptor 16 at a predetermined power level. A predetermined DC voltage is applied from the variable DC power supply 50 to the upper electrode 34. By applying a DC voltage from the DC power supply 22 for the electrostatic chuck 18 to the electrode 20 of the electrostatic chuck 18, the semiconductor wafer W is fixed on the susceptor 16.

The processing gas injected from the gas injection openings 37 formed at the electrode plate 36 of the upper electrode 34 is turned into a plasma by glow discharge that occurs between the upper electrode 34 and the susceptor 16 serving as the lower electrode by the high frequency power. A processing surface of the semiconductor wafer W is etched by radicals or ions generated from the plasma.

In the plasma etching apparatus, the high frequency power having a high frequency range (e.g., 10 MHz or above) is supplied from the first high frequency power supply 89 to the susceptor 16 serving as the lower electrode, so that the plasma can be generated at a high density in a desirable state. Therefore, it is possible to form a high-density plasma even under a lower pressure condition.

Embodiment of the Plasma Etching Method

Figure 3:
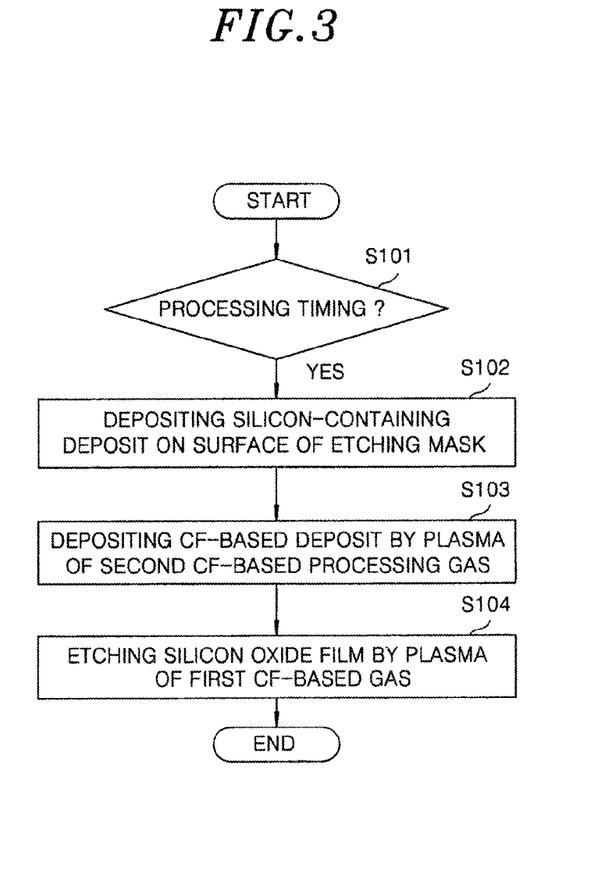
FIG. 3 is a flowchart showing an example of a sequence of a plasma etching process in the plasma etching apparatus in accordance with the embodiment of the present invention.

FIG. 3 is a flowchart showing an example of a sequence of plasma etching performed by the plasma etching apparatus in accordance with the embodiment of the present invention. As will be described in detail later, the plasma etching apparatus performs a series of processes on a processing target substrate including a base layer, a silicon oxide film, and an etching mask made of polysilicon and having an etching pattern which are formed in this order.

The base layer is polysilicon, SiC, SiN or the like. The silicon oxide film is, e.g., $SiO_2$, TEOS (Tetraethoxysilane) or the like.

As shown in FIG. 3, when it is a processing timing (YES in step S101), the plasma etching apparatus performs a deposition step for depositing a silicon-containing deposit on a surface of the etching mask by the plasma of the processing gas while applying a negative DC voltage to the upper electrode made of silicon (step S102). For example, the plasma etching apparatus deposits the silicon-containing deposit while using as the processing gas, e.g., $H_2$/Ar gas, $CF_4/H_2$/Ar gas and $CF_4$/COS/Ar gas.

Figure 4A:
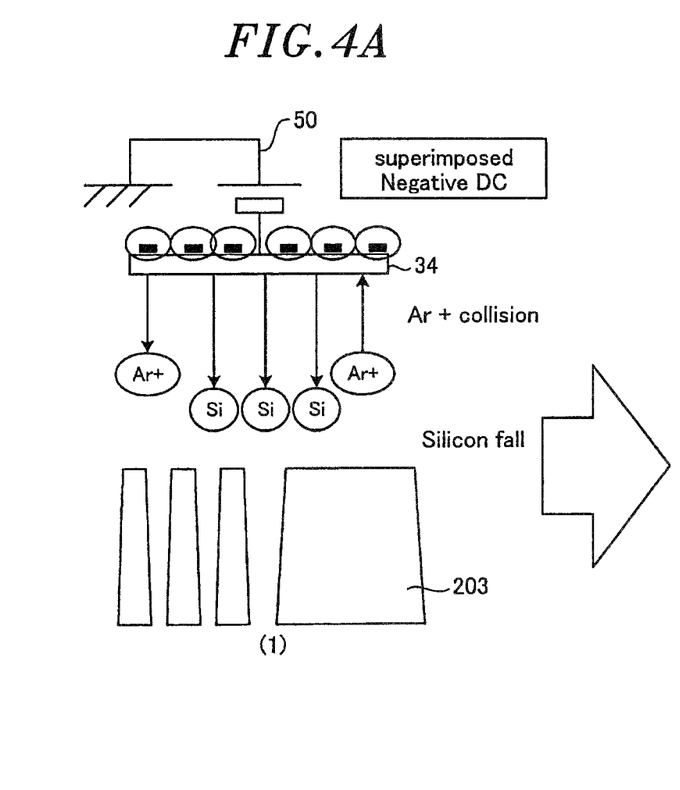
FIGS. 4A and 4B show a deposition step in the embodiment of the present invention.
Figure 4B:
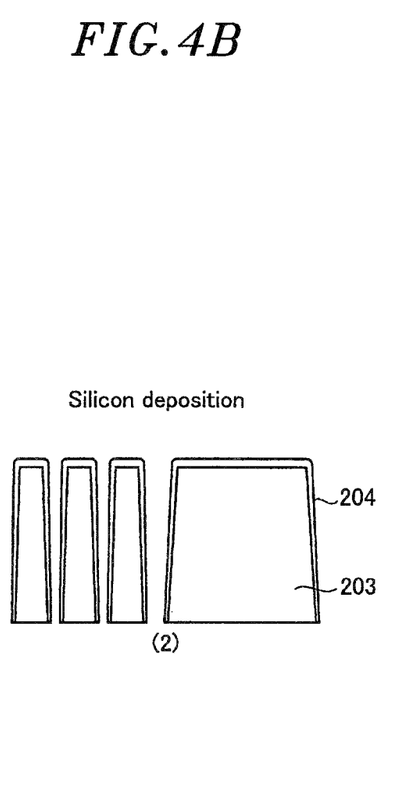

FIGS. 4A and 4B show the deposition step in the embodiment. The plasma etching apparatus applies the high frequency power from the first high frequency power supply and also applies a predetermined DC voltage from the variable DC power supply 50 to the upper electrode 34. At this time, the high frequency power for ion attraction from the second high frequency power supply 90 is not applied. In other words, as shown in FIG. 4A, the plasma etching apparatus applies a negative DC voltage having a predetermined polarity and magnitude from the variable DC power supply 50 to the upper electrode 34 during plasma generation. More preferably, the plasma etching apparatus applies a voltage from the variable DC power supply 50 such that a self-bias voltage Vdc on the surface of the electrode plate 36 becomes large enough to obtain a predetermined (appropriate) sputtering effect for the surface of the electrode plate 35 which is the surface of the upper electrode 34 to which the DC voltage is applied, i.e., such that an absolute value of Vdc on the surface of the upper electrode 34 is increased. The plasma etching apparatus supplies as the processing gas, e.g., $H_2$/Ar gas, $CF_4/H_2$/Ar gas and $CF_4$/COS/Ar gas, into the chamber 10.

As a result, as shown in FIG. 4A, collision of ions against the surface of the electrode plate 36 is accelerated and a falling amount of silicon forming the upper electrode 34 or a falling amount of electron beam is increased. In the example shown in FIG. 4A, Ar ions collide with the surface of the electrode plate 36 and the silicon forming the electrode plate 36 falls on the etching mask 203. Accordingly, a silicon-containing deposit 204 is deposited on the etching mask 203 made of polysilicon as shown in FIG. 4B. As a result, the roughness problem of the surface of the etching mask 203 is solved and the selectivity of the etching mask 203 can be improved. By performing the etching after the deposition step, an angle of a source select line can become more vertical and the line after the etching can become more smooth.

Referring back to FIG. 3, the plasma etching apparatus performs a deposition step for depositing a CF-based deposit by a plasma of a second CF-based processing gas (step S103). For example, the plasma etching apparatus deposits a CF-based deposit on the etching mask by using $C_4F_6$/Ar/$O_2$ gas. In other words, the CF-based deposit is deposited on the line that has become smooth by the deposition of the silicon-containing deposit.

A more specific example will be described. The plasma etching apparatus applies the high frequency power from the first high frequency power supply 89 and also applies a predetermined DC voltage from the variable DC power supply to the upper electrode 34. At this time, the high frequency power for ion attraction from the second high frequency power supply 90 is not applied. The plasma etching apparatus supplies, e.g., $C_4F_6/Ar/O_2$ gas into the chamber 10. As a result, the CF-based deposit is deposited on the etching mask.

Next, the plasma etching apparatus performs an etching step of etching a silicon oxide film by a plasma of the first CF-based gas while using as a mask the etching mask having the silicon-containing deposit deposited thereon (step S104). For example, the plasma etching apparatus performs the etching by using as the first CF-based gas, e.g., $C_4F_6/C_4F_8/Ar/O_2$ gas.

The processing sequence shown in FIG. 3 is not limited to the above sequence and may be properly changed within a range that does not contradict the processing contents. In the example shown in FIG. 3, after the deposition step and before the etching step, the deposition step of depositing a CF-based deposit by the plasma of the second CF-based processing gas is performed. However, the present invention is not limited to the above and the deposition step of depositing a CF-based deposit may not be executed.

Effect of the First Embodiment

In the above-described first embodiment, the silicon-containing deposit is deposited on the surface of the etching mask by the plasma of the processing gas while applying a negative DC voltage to the upper electrode made of silicon and, then, the silicon oxide film is etched by the plasma of the first CF-based gas while using as the mask the etching mask having the silicon-containing deposit deposited thereon. As a result, the mask selectivity in the case of using a polysilicon mask as a mask can be improved. In other words, the roughness problem of the surface of the etching mask is solved and the selectivity of the etching mask can be improved. By performing the etching after the deposition step, an angle of a source select line can become more vertical and the line after the etching can become more smooth. In other words, the etching can be performed with high selectivity while ensuring plasma resistance of the etching mask at a high level.

For example, in the first embodiment, the mask selectivity can be improved while maintaining permeability by depositing silicon deposit before the etching. Since the silicon-containing deposit is deposited, the mask becomes thick and the line can be thickly etched. Accordingly, a wiggling resistance can be improved.

In the first embodiment, when the plasma is generated, a DC voltage having a predetermined polarity and level is applied from the variable DC power supply 50 to the upper electrode 34. At this time, it is preferable to control the voltage from the variable DC power supply 50 by using a controller 51 such that a self-bias voltage Vdc on the surface of the electrode plate 36 becomes large enough to obtain a predetermined (appropriate) sputtering effect for the surface of the electrode plate 35 which is the surface of the upper electrode 34 to which the DC voltage is applied, i.e., such that an absolute value of Vdc on the surface of the upper electrode 34 is increased. When the plasma is generated by applying a high frequency power from the first high frequency power supply 89, polymer may be adhered to the upper electrode 34. However, by applying a proper DC voltage from the variable DC power supply 50, the polymer adhered onto the upper electrode 34 is sputtered and the surface of the upper electrode 34 can become clean.

In the first embodiment, the processing gas is selected among $H_2/Ar$ gas, $CF_4/H_2/Ar$ gas and $CF_4/COS/Ar$ gas. As a result, the silicon-containing deposit can be reliably deposited on the etching mask.

In the first embodiment, after the deposition step and before the etching step, a CF-based deposit is deposited by the plasma of the second CF-based processing gas. As a result, the mask selectivity can be further improved compared to the case where the CF-based deposit is not deposited.

In the first embodiment, the first CF-based gas is $C_4F_6/C_4F_8/Ar/O2$ gas. As a result, the etching can be reliably performed while using as the mask the etching mask having the silicon-containing deposit deposited thereon.

In the first embodiment, the second CF-based gas is $C_4F_6/Ar/O_2$ gas. As a result, the CF-based deposit can be reliably deposited.

TEST EXAMPLES

Hereinafter, test examples of the plasma etching method will be described in detail. However, the plasma etching method is not limited to the following test examples.

Comparative Example 1

In a comparative example 1, a processing target substrate was etched under the following conditions.
(Etching Step)
Processing gas: $C_4F_6/C_4F_8/Ar/O_2$ (13/24/600/27 sccm)
Pressure: 2.7 Pa (20 mTorr)
High frequency power from the first high frequency power supply: 750 W
High frequency power from the second high frequency power supply: 500 W
DC voltage applied to the upper electrode: −150V
Time: 16.5 sec Test Example 1

Figure 5:
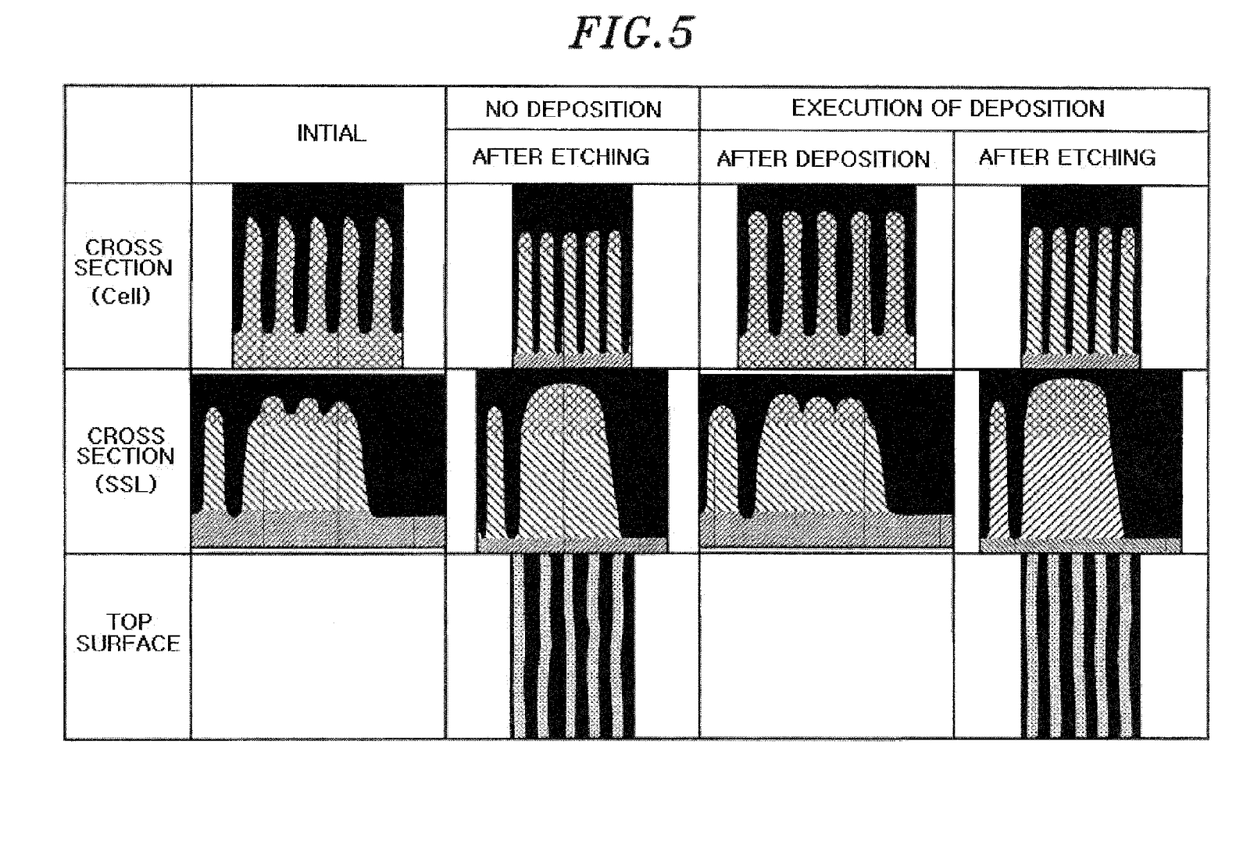
FIG. 5 shows examples of structures of processing target substrates in a test example 1 and a comparative example 1.

In a test example 1, a deposition step for depositing a silicon-containing deposit and a deposition step for depositing a CF-based deposit were sequentially performed on a processing target substrate. Then, an etching step was executed. The etching step in the test example 1 was carried out in the same manner as that in the comparative example 1.
(Deposition Step for Depositing a Silicon-Containing Deposit)
Processing gas: $H_2/CF_4/Ar$ (100/40/800 sccm)
Pressure: 6.6 Pa (50 mTorr)
High frequency power from the first high frequency power supply: 300 W
High frequency power from the second high frequency power supply: 0 W
DC voltage applied to the upper electrode: −900V
Time: 10 sec
(Deposition Step for Depositing a CF-Based Deposit)
Processing gas: $C_4F_6/Ar/O_2$ (40/800/30 sccm)
Pressure: 3.3 Pa (25 mTorr)
High frequency power form the first high frequency power supply: 1250 W
High frequency power from the second high frequency power supply: 0 W
DC voltage applied to the upper electrode: −300V
Time: 13.7 sec FIG. 5 shows examples of structures of processing target substrate in the test example 1 and the comparative example 1. In FIG. 5, there are illustrated trace diagrams of 350000 times enlarged images of cross sections (Cell), cross sections (SSL, source select line) and top surfaces of a substrate before processing, an etching substrate in the comparative example 1, a substrate having a silicon-containing deposit deposited thereon in the test example 1, an etched substrate in the test example 1. In FIG. 5, "initial" indicates an unprocessed substrate; "no deposition" indicates a processing target substrate in the comparative example; "execution of deposition, after deposition" indicates a processing target substrate having a silicon-containing deposit deposited thereon in the test example 1; and "execution of deposition, after etching" indicates an etched substrate in the test example 1. The cross section (Cell) shows a central portion of the processing target substrate. The cross section (SSL, source select line) shows an edge portion of the processing target substrate.

In the comparative example 1, the remaining amount of the etching mask after the etching was "19.8 nm"; the angle of SSL was "83.7°"; and LWR and LER were "1.3 nm" and "2.5 nm", respectively. On the other hand, in the test example 1, the remaining amount of the etching mask after the etching was "24.4 nm"; the angle of SSL was "84.2°"; and LWR and LER were "1.2 nm" and "2.4 nm", respectively. The LWR (line width roughness) and the LER (line edge roughness) indicate a size of an irregularity formed on a wall surface of a fine pattern such as a line or a gate electrode in a semiconductor field. For example, LWR indicates variation of a pattern width which is caused by irregularities on the surface of the line. Specifically, a line width including irregularities is measured at a plurality of different positions and the standard deviation thereof is calculated. A value three times greater than the standard deviation becomes the LWR. Meanwhile, a reference line is determined at an end portion of the line and a dimension from the reference line to irregularities at the end portion of the line is measured at multiple positions. The standard deviation thereof is calculated and a value three times greater than the standard deviation becomes the LER.

As can be seen from the comparison between the test example 1 and the comparative example 1, in the test example 1, silicon-containing deposit is deposited, so that a larger amount of the etching mask remains compared to the case where the silicon-containing deposit is not deposited, which makes the mask selectivity improved. Further, in the test example 1, an angle of the SSL can become close to a right angle compared to the comparative example 1.

Test Examples 2 to 4

In the test examples 2 to 4, in the silicon deposition step, the following processing gases and flow rates are used. The other conditions are the same as those of the test example 1.

Test example 2: $H_2/Ar$ (100/800 sccm)
Test example 3: $H_2/CF_4/Ar$ (100/40/800 sccm)
Test example 4: $COS/CF_4/Ar$ (20/40/800 sccm)

Figure 6:
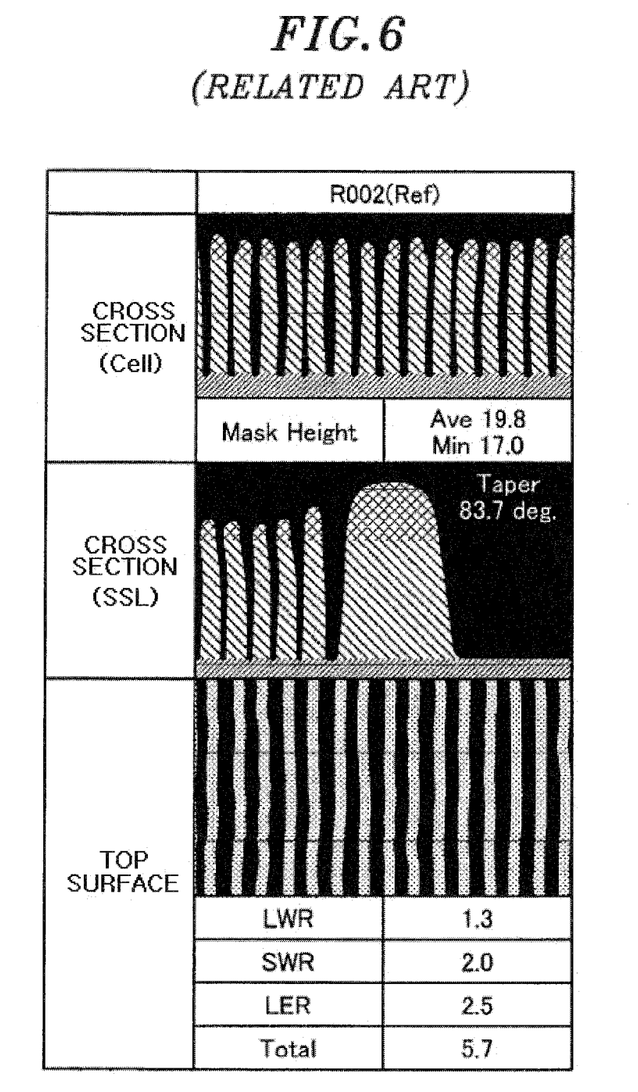
FIG. 6 shows a processing result of a comparative example 2.
Figure 7:
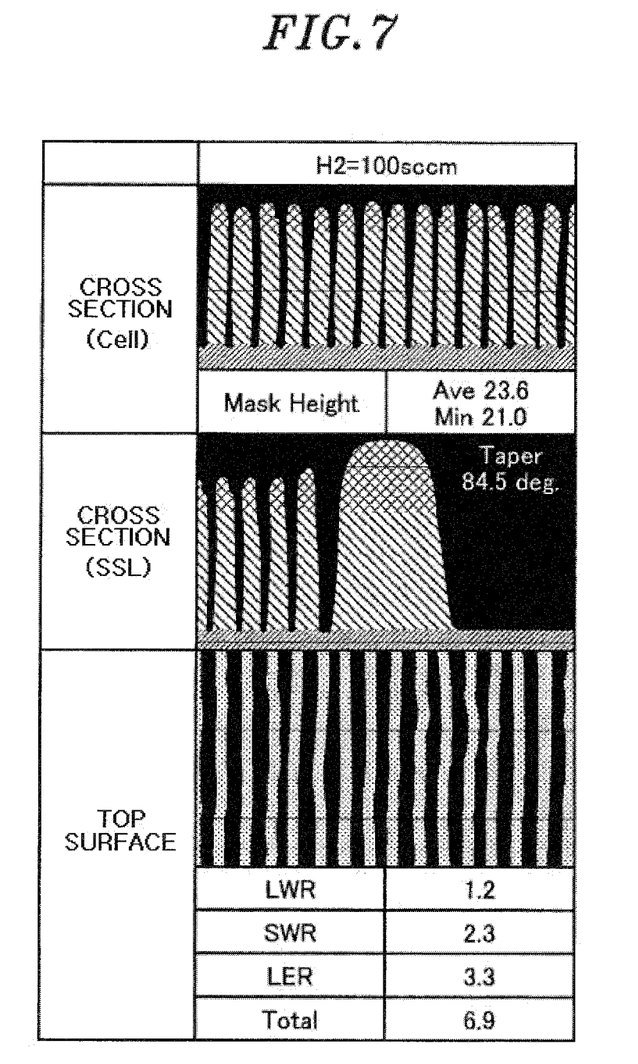
FIG. 7 shows a processing result of a test example 2.
Figure 8:
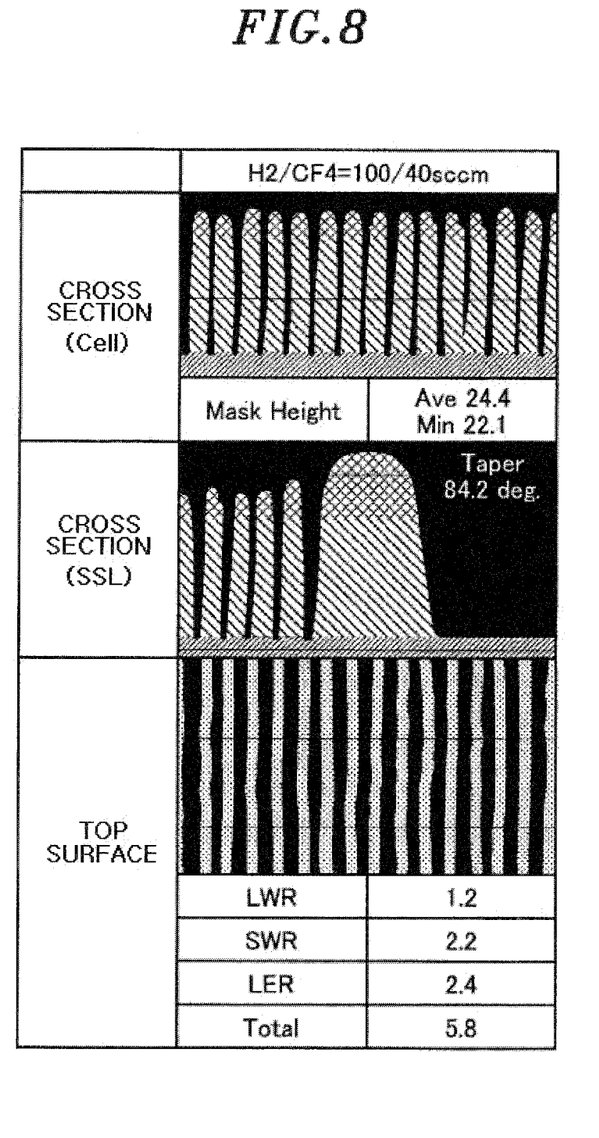
FIG. 8 shows a processing result of a comparative example 3.
Figure 9:
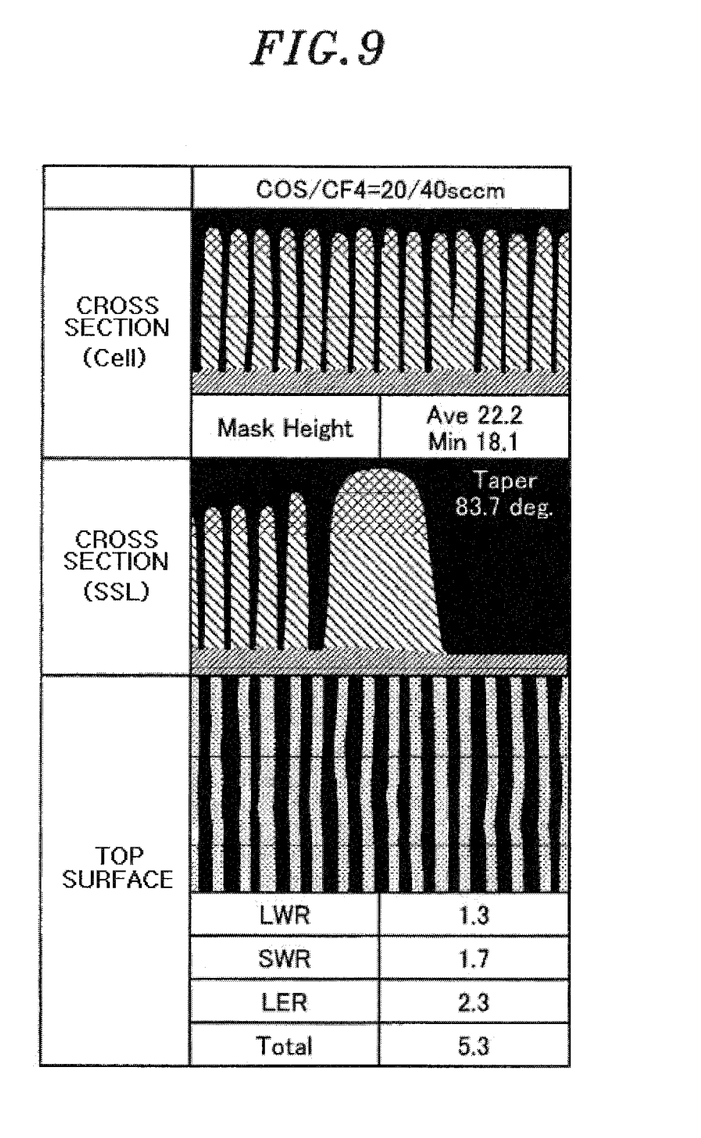
FIG. 9 shows a processing result of a test example 3.

FIG. 6 shows the processing result of the comparative example 1. FIG. 7 shows the processing result of the test example 2. FIG. 8 shows the processing result of the test example 3. FIG. 9 shows the processing result of the test example 4. In FIGS. 6 to 9, there are illustrated trace diagrams of 350000 times enlarged images of the cross sections (Cell), the cross sections (SSL) and the top surfaces after the etching, the height of the etching mask remaining after the etching, LWR, SWR, LER and the total of LWR, SWR and LER. As in the case of calculating the LWR or the like, a SWR (space width roughness) is obtained by calculating a dimension of a space between lines including irregularities. Further, an average and a minimum value of the height of the etching mask are illustrated. The LWR, the SWR, the LER and the total thereof indicate the smoothness of the line.

As shown in FIGS. 6 and 7, by using $H_2/Ar$ in the silicon deposition step, the height of the remaining etching mask can become higher and the mask selectivity can be improved compared to the method in which the silicon deposition step is not executed. Further, the SSL can become more perpendicular.

As shown in FIGS. 6 and 8, by using $H_2/CF_4/Ar$ in the silicon deposition step, the height of the remaining etching mask can become higher and the mask selectivity can be improved compared to the method in which the silicon deposition step is not executed. Further, the SSL can become more perpendicular. Moreover, by using $H_2/CF_4/Ar$ in the silicon deposition step, the smoothness of the line can be maintained at the substantially same level.

As shown in FIGS. 6 and 9, by using $COS/CF_4/Ar$ in the silicon deposition step, the height of the remaining etching mask can become higher and the mask selectivity can be improved compared to the method in which the silicon deposition step is not executed. The angle of the SSL can be maintained at the substantially same level without deterioration compared to the method in which the silicon deposition step is not executed. Further, by using $COS/CF_4/Ar$ in the silicon deposition step, the smoothness of the line can be improved.

DESCRIPTION OF REFERENCE NUMERALS 10 chamber
32 gas supply line
34 upper electrode
36 electrostatic plate
50 variable DC power supply
51 controller
87 matching unit
88 matching unit
89 high frequency power supply
90 high frequency power supply
95 control unit
96 user interface
97 storage unit
203 etching mask
204 silicon-containing deposit

What is claimed is:

1. A plasma etching method comprising:
   providing a substrate including a base layer, a silicon oxide film disposed on the base layer, and an etching mask formed of a polysilicon and having an etching pattern;
   a deposition step of depositing a silicon-containing deposit on the substrate by a plasma of a processing gas while applying a negative DC voltage to an upper electrode made of silicon, wherein during the deposition step the silicon-containing deposit is deposited on the etching mask; and
   an etching step of etching the silicon oxide film by a plasma of a first CF-based gas while using as a mask the etching mask having the silicon-containing deposit deposited thereon,
   wherein the silicon-containing deposit includes silicon that originated from the upper electrode.

2. The plasma etching method of claim 1, wherein the processing gas is selected among $H_2$/Ar gas, $CF_4$/$H_2$/Ar gas and $CF_4$/COS/Ar gas.

3. The plasma etching method of claim 1, further comprising, after the deposition step and before the etching step, a deposition step of depositing a CF-based deposit by a plasma of a second CF-based gas.

4. The plasma etching method of claim 1, wherein the first CF-based gas is $C_4F_6$/$C_4F_8$/Ar/$O_2$ gas.

5. The plasma etching method of claim 3, wherein the second CF-based gas is $C_4F_6$/Ar/$O_2$ gas.

* * * * *